United States Patent [19]

Lobsinger et al.

[11] Patent Number: 4,600,924
[45] Date of Patent: Jul. 15, 1986

[54] AUTOMATIC FREQUENCY CONTROL FOR RADAR RECEIVER

[75] Inventors: James R. Lobsinger, Boca Raton; Steven R. Sweet, Margate, both of Fla.; Eckard F. Natter, Phoenix, Ariz.

[73] Assignee: Allied Corporation, Morristown, N.J.

[21] Appl. No.: 591,713

[22] Filed: Mar. 21, 1984

[51] Int. Cl.[4] .............................................. H03L 7/08
[52] U.S. Cl. ......................... 343/17.1 R; 343/5 AF; 343/7 A; 331/4
[58] Field of Search ............ 343/5 AF, 17.1 R, 5 DP, 343/7 A, 7 PL, 7 AG; 331/175, 176, 1 A, 10, 15, 11, 14, 17, 4; 455/164; 364/157

[56] References Cited

U.S. PATENT DOCUMENTS

| | | | |
|---|---|---|---|
| 3,162,814 | 12/1964 | Aasen et al. | 343/17.1 R |
| 3,875,525 | 4/1975 | Ballinger et al. | 331/1 A |
| 3,922,609 | 11/1975 | Grohmann | 331/1 A |
| 3,936,753 | 2/1976 | Clark | 455/164 |
| 3,943,459 | 3/1976 | Tosto | 331/4 |
| 3,964,064 | 6/1976 | Brandao et al. | 343/5 SC |
| 4,048,581 | 9/1977 | Lyberg | 331/1 A |
| 4,083,015 | 4/1978 | Popodi | 331/4 |
| 4,228,434 | 10/1980 | Williamson et al. | 331/10 |
| 4,272,729 | 6/1981 | Riley, Jr. | 331/1 A |

Primary Examiner—Thomas H. Tarcza
Assistant Examiner—Bernarr Earl Gregory
Attorney, Agent, or Firm—B. L. Lamb; R. M. Trepp

[57] ABSTRACT

A digital automatic frequency control for a pulse-type radar receiver having a voltage controlled local oscillator. A first digital number is generated and converted to a first analog voltage for coarse control of the local oscillator frequency. The first digital number is varied during the time output from the radar transmitter is present at the receiver mixer. The first digital number is varied causing sweep of the local oscillator frequency. When the difference frequency output from the mixer is at a value to cause output from the receiver intermediate frequency amplifier of a predetermined level, variation of the first digital number is halted, providing a coarsely tuned local oscillator frequency. A second digital number is then generated, converted to a second analog voltage which is combined with the first analog voltage. The second digital number is varied to cause the local oscillator frequency to be sidestepped above and below the coarsely tuned frequency. Samples of the receiver output are separately accumulated for sidesteps above and below the coarsely tuned frequency. The difference between the separated accumulated outputs is used to generate a third digital number which is converted to a third analog voltage. The third analog voltage is combined with the first analog voltage to fine tune the local oscillator frequency.

10 Claims, 5 Drawing Figures

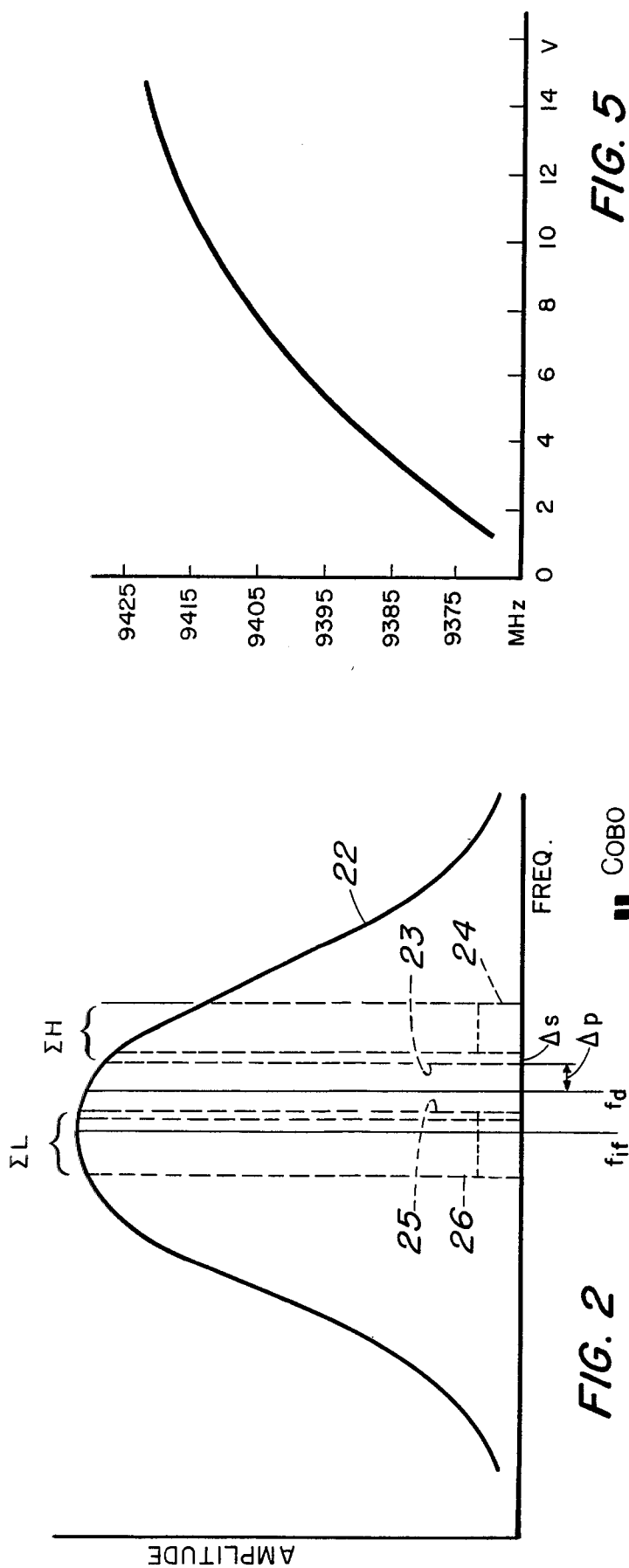
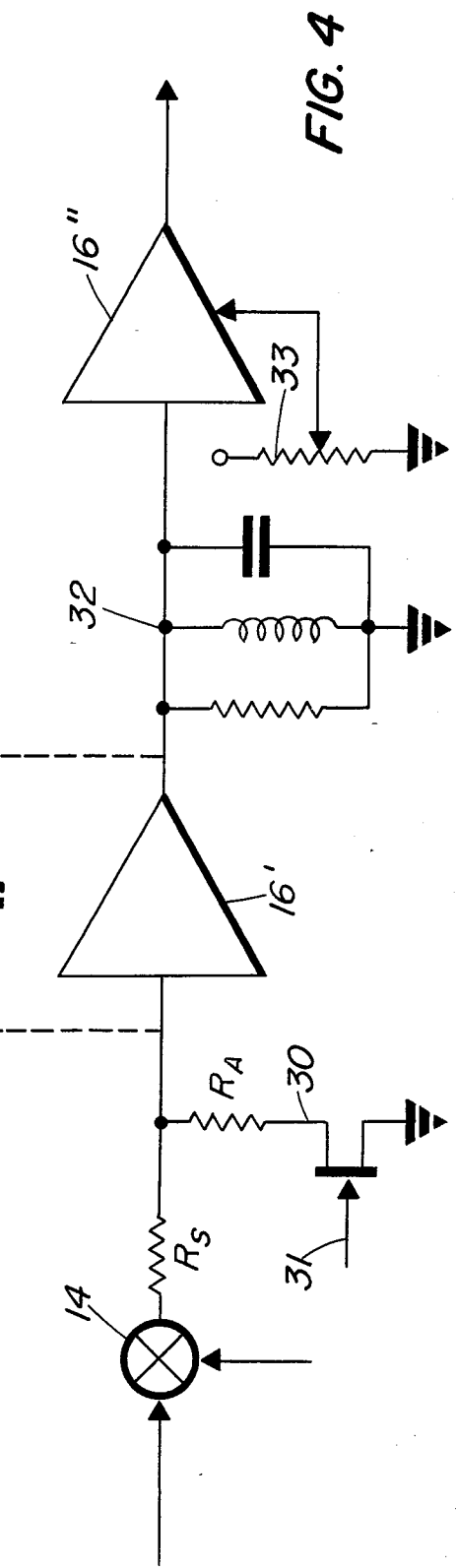
FIG. 5
FIG. 4
FIG. 2

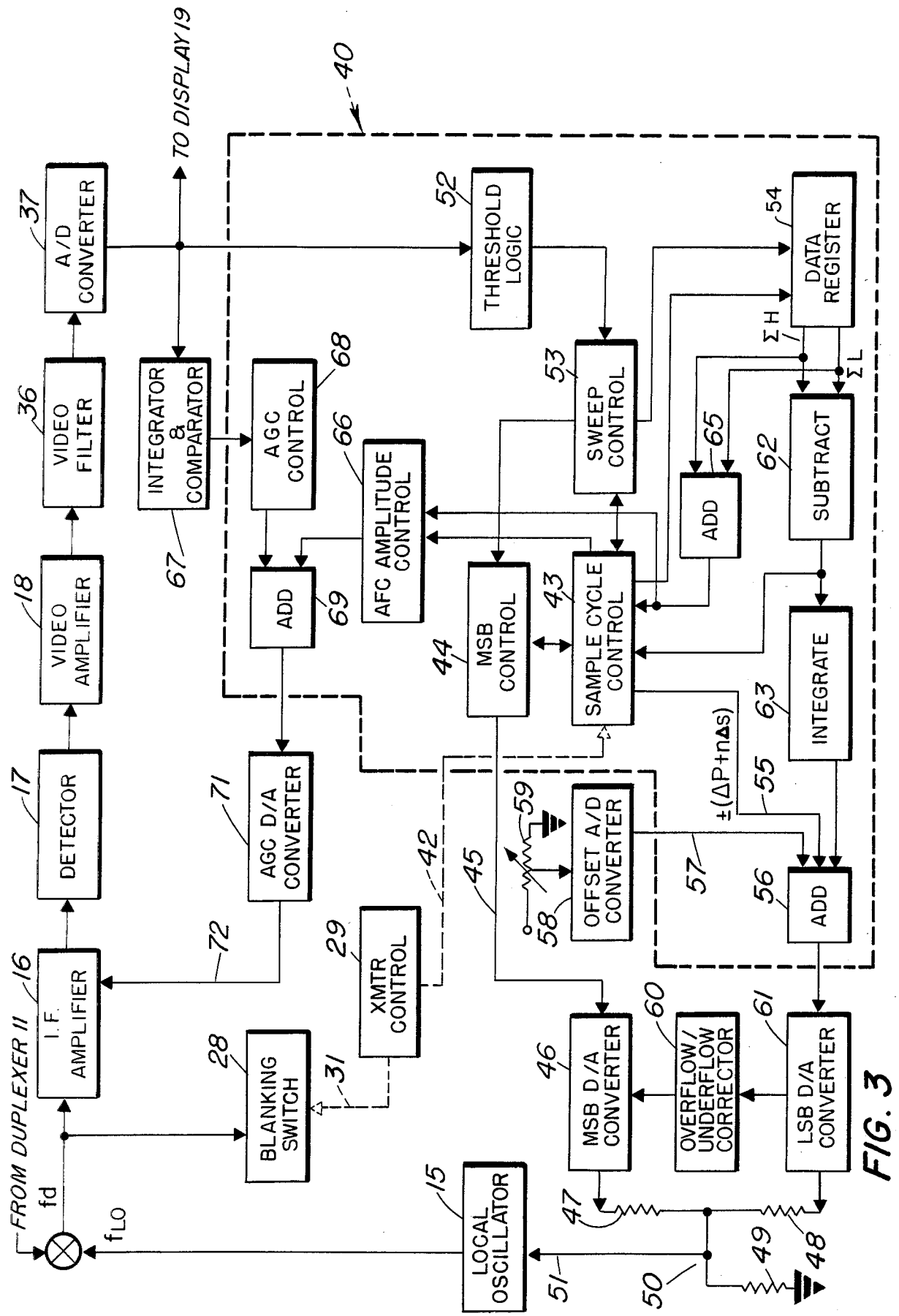

AUTOMATIC FREQUENCY CONTROL FOR RADAR RECEIVER

The present invention relates to an automatic frequency control for pulse-type radar receivers. More particularly, it relates to an automatic frequency control for a radar receiver local oscillator in which the bandpass characteristic of the receiver is directly utilized, through digitally controlled sampling means, to adjust and maintain the receiver local oscillator frequency to the precise value necessary to produce an intermediate frequency output which is centered in the receiver passband at maximum gain.

Superheterodyne receivers used in radar systems are of the same general form as superheterodyne broadcast receivers. The radar return signals, being reflections of the transmitted pulse signals, appear at the receiver input on the same carrier frequency as the transmitter pulses, except for a possible Doppler shift in frequency. The return signals are mixed with the output of a local oscillator to produce intermediate frequency signals, which are amplified in a multi-stage i.f. amplifier, detected, further amplified in a video amplifier and finally displayed.

The receiver local oscillator must be tuned to a frequency differing from the transmitter carrier precisely by the amount of the frequency at the center of the i.f. amplifier passband or else the receiver performance will be degraded. The radar transmitters most commonly used have poor frequency stability. The frequency of the carriers generated therein may vary substantially over a short time span because of variations in voltage, temperature, pressure and the antenna standing wave ratio. Manual adjustment of the local oscillator frequency to maintain the receiver in tune is impractical. Therefore some form of automatic frequency control (AFC) for the receiver local oscillator is provided as a necessary feature of pulse-type radar systems.

The AFC in widest use comprises a voltage controlled local oscillator and a control loop for generating the oscillator control voltage which includes a mixer, an i.f. amplifier and a frequency discriminator. The AFC mixer and AFC i.f. amplifier are separate from the mixer and i.f. amplifier to which the radar return signals are applied. The center frequency of the AFC i.f. amplifier and crossover frequency of the discriminator are aligned. A highly attenuated sample of the transmitter pulse is injected into the AFC mixer together with a portion of the local oscillator output, the resulting difference frequency signal is amplified in the AFC i.f. amplifier and applied to the discriminator where a control voltage is developed of the proper sense to maintain the local oscillator frequency at a value producing an AFC mixer difference frequency equal to the discriminator crossover frequency.

The conventional AFC system, for proper operation, requires that the AFC mixer, i.f. amplifier and discriminator be accurately aligned with the receiver mixer and i.f. amplifier and that the bandpass characteristics of these stages vary nearly identically with changes in temperature, voltage or other factors having an influence on such characteristics. The critical importance of maintaining coincidence between the bandpass characteristics of the AFC i.f. amplifier, the AFC frequency reference, i.e. the discriminator crossover frequency, and the bandpass characteristics of the receiver mixer and i.f. stages increases the initial cost and adds to the maintenance cost of a radar system. The conventional AFC system also reduces the reliability of the radar because of the likelihood of the development of misalignments during use.

It is an object of the present invention to provide an improved AFC for a radar receiver which employs the bandpass characteristic of the receiver i.f. amplifier directly to control the frequency of the receiver local oscillator.

It is a further object of the invention to provide an AFC for a radar receiver wherein the requirement for maintaining coincidence in the frequency characteristics of several separate circuits is eliminated, thereby simplifying the manufacture, reducing the costs and improving the reliability of the system.

It is still another object of the invention to provide an AFC for a radar receiver which includes means for controlling the gain of the receiver i.f. amplifier during the AFC sample time so that gain variations due to aging or other causes may be compensated.

These and other objects of the invention will become apparent as an understanding of the invention is gained through study of the following detailed description and the accompanying drawings.

Briefly, the invention comprises an AFC for a radar receiver having digital control means or the receiver local oscillator whereby the local oscillator frequency is adjusted to and maintained at a value producing a mixer difference frequency centered within the receiver i.f. amplifier bandpass characteristic. The AFC includes means for sweeping the local oscillator frequency to tune the local oscillator coarsely to a frequency to produce a difference frequency output from the receiver mixer which is within the passband of the i.f. amplifier. Thereafter, fine tuning means come into play to tune the local oscillator frequency to a value producing a mixer output frequency centered at maximum gain within the i.f. amplifier passband.

During transmission of a pulse, a highly attenuated portion of the pulse is applied to the receiver mixer. The mixer output is amplified in the i.f. amplifier operating at reduced gain. The analog output of the i.f. amplifier is converted to a four digit binary number by a four level sample and hold comparator. When the comparator output rises to a theshold value, the local oscillator sweep is arrested, holding the local oscillator frequency at a value which produces an i.f. frequency, $f_d$ nominally at the center of the i.f. amplifier passband. During subsequent transmitter pulses, the fine tuning control sidesteps the local oscillator frequency to produce mixer output frequencies incrementally stepped above and below the nominal i.f. amplifier frequency $f_d$. At the end of each transmitter pulse, local oscillator frequency is restored to the value producing the nominal frequency $f_d$ so that the reciever operates normally during intervals between transmitted pulses.

Returning to operation during transmission, the digitized output of the i.f. amplifier is stored for each sidestep increment of the local oscillator frequency. The sum of such outputs for the increments producing mixer outputs above the frequency $f_d$ is compared with the sum of the outputs for the incremental steps producing mixer outputs below $f_d$. The difference between these sums is proportional to the displacement of the local oscillator frequency from the frequency required to produce a mixer output frequency which is centered in the passband at maximum gain of the i.f. amplifier. The average of the absolute values of such sums provides a reference which is used to compensate for changes in the i.f. amplifier gain.

In the drawings:

FIG. 2 is a chart showing the frequency response of a typical i.f. amplifier and showing the responses obtained by side stepping the local oscillator frequency in accordance with the invention;

FIG. 3 is a functional block diagram of the automatic frequency control of the invention;

FIG. 4 is a simplified schematic diagram of the blanking switch and a portion of the i.f. amplifier shown in FIG. 3; and FIG. 5 is a chart showing the frequency vs. control voltage characteristic of a typical solid state microwave local oscillator.

Figure 1:
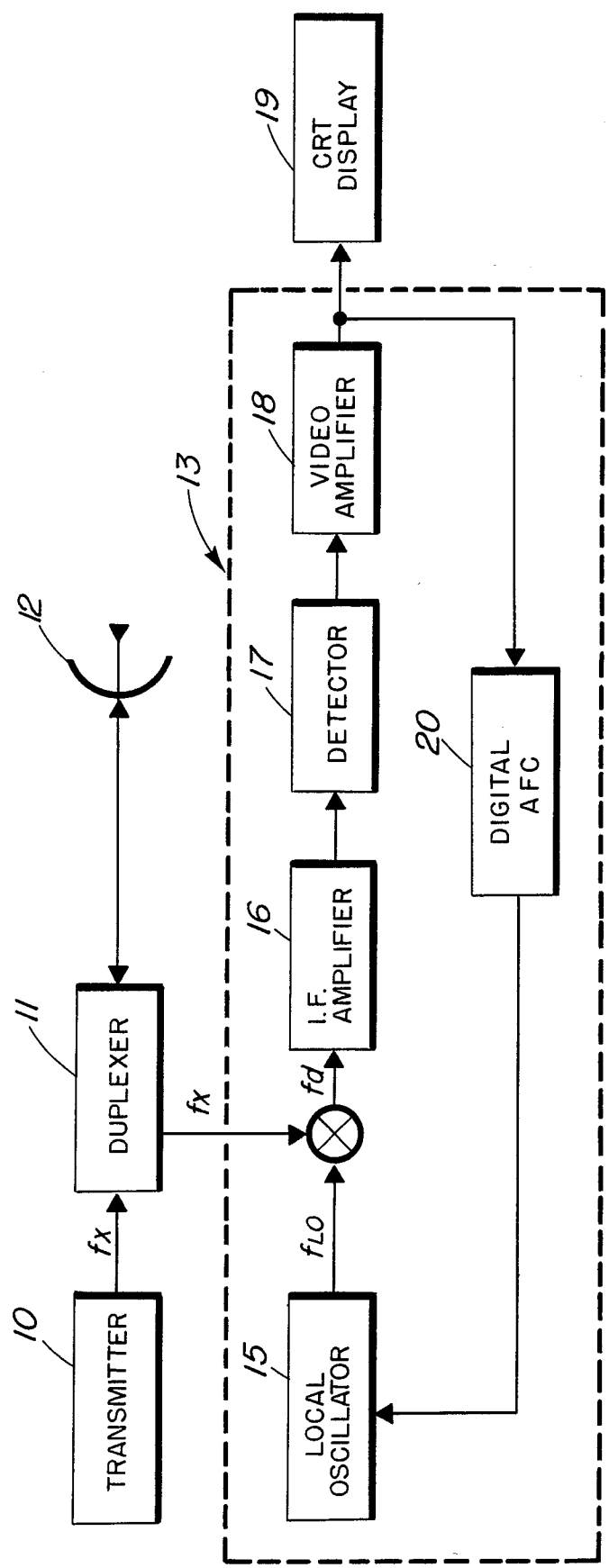
FIG. 1 is a simplified functional block diagram of a radar receiver incorporating the automatic frequency control of the invention.

Referring to FIG. 1, wherein a simplified block diagram of a typical radar system appears, a pulse type transmitter 10 produces pulses of r.f. carrier suitably at a frequency of 9345 MHz. The pulses pass through a duplexer 11 to an antenna 12 and are radiated into space. Reflections from objects within the antenna beam return to the antenna whence they again pass through the duplexer in the reverse direction and are diverted to the receiver 13. The return signal pulses from duplexer 11 enter the receiver mixer 14 where they are combined with the output of a local oscillator 15 operating at a frequency $f_{lo}$ which is offset from the transmitter frequency $f_x$ by an amount to produce a mixer difference frequency output $f_d$ which is desirably equal to the center frequency of the passband of i.f. amplifier 16. The output of i.f. amplifier 16, after being detected in detector 17, is further amplified in video amplifier 18 then displayed on a cathode ray tube display 19. Pulses from detector 17 are also applied to a digital AFC 20, the subject of the present invention, which produces a control voltage output for local oscillator 15 of proper magnitude and sense to adjust the frequency $f_{lo}$ to the value required to produce a mixer output frequency $f_d$ centered in the passband of i.f. amplifier 16.

FIG. 2 provides an insight to the operation of the digital AFC 20. Curve 22 shows the amplitude of the response of i.f. amplifier 16 to constant amplitude signals at various frequencies. Curve 22 defines the passband of the i.f. amplifier. Peak response is obtained at an input signal frequency $f_{i.f.}$, typically 30 MHz. The curve shows symmetrical attenuation for input signals at frequencies above and below the amplifier passband center frequency $f_{i.f.}$. When the local oscillator frequency $f_{lo}$ is not at the correct frequency to produce a mixer output frequency $f_d$ aligned with $f_{i.f.}$, as is shown in FIG. 2, the receiver performance is degraded. The return signals actually comprise a spectrum of frequency components surrounding the transmitter carrier frequency. These components, after being heterodyned in the mixer with the local oscillator output appear as sidebands surrounding the frequency $f_d$. As is apparent, degraded amplitude response of the carrier frequency component and marked amplitude distortion occurs whenever the local oscillator is tuned to an incorrect frequency.

The digital AFC 20 makes use of the degraded amplitude response of the i.f. amplifier resulting from incorrect local oscillator tuning to adjust the local oscillator to the proper frequency. The AFC causes the local oscillator frequency to vary in incremental steps $\Delta s$, both above and below the coarse tuning frequency, to produce the i.f. amplifier responses as shown by lines 23, 24 and 25, 26. In the prefered embodiment of the invention, line 23 represents the initial amplifier response and line 24 represents the final amplifier response for sixteen incremental steps in the local oscillator frequency above the coarse tuning frequency. Line 25 represents the initial response and line 26 represents the final response for sixteen incremental steps in the local oscillator frequency below the coarse tuning frequency. The amplifier response for each of the steps 23–24 is stored in an accumulater which produces the sum output $\Sigma H$. Similarly, the amplifier response for each of the steps 25–26 is stored in an accumulater which produces the sum output $\Sigma L$. Whenever the local oscillator is incorrectly tuned to produce a frequency $f_d$ which is higher than $f_{i.f.}$, $\Sigma L$ will be of greater magnitude than $\Sigma H$, as is shown. Obviously, when $f_d$ is aligned with $f_{i.f.}$ symmetry of the curve results in equal $\Sigma H$ and $\Sigma L$ outputs. Accordingly, the difference in the magnitude of the $\Sigma H$ and $\Sigma L$ outputs provides an error signal having an amplitude proportional to the frequency error of $f_d$ and the polarity of such difference indicates the sense of the necessary correction in the frequency $f_d$.

The functional aspects and structure of the digital AFC 20 are shown in greater detail in FIG. 3, to which reference 14 is now made. The difference frequency $f_d$ output of mixer is applied to the input of i.f. amplifier 16 under control of a blanking switch 28. Blanking switch 28 is operative, in response to control signals from transmitter control 29, to provide attenuation of the transmitter pulse in addition to that provided by duplexer 11 for the duration of the outgoing transmitter pulse. Transmitter control 29 includes, conventionally, a pulse generator, the transmitter modulator and the transmitter range selector control which determines the transmitter pulsewidth and pulse repetition frequency in accordance with the range scale selected by the operator.

Referring to FIG. 4, blanking switch 28 may suitably comprise a transistor 30 which is biased to conduct for the duration of a transmitter pulse by a trigger signal on line 31. When conductive, transistor 30 interposes resistor $R_a$ on the input line to the first stage 16' of amplifier 16, thereby cutting-off amplification by that stage and diverting a large portion of the duplexer leakage signal to ground. The remaining portion of the leakage signal is coupled through the base to collector capacitance $C_0 B_0$ the tuned load impedance 32 of stage 16', resulting in further attenuation. The now highly attenuated leakage pulse appears at the input of the second stage 16" which preferably includes means 33 for manually adjusting the amplifier gain to compensate for variations in transmitter power, mixer efficiency and the like resulting from differences in manufacturing tolerances. Preferably i.f. amplifier 16 includes further amplifying stages, the gain of which is automatically controlled as described hereinafter. Also, as is conventional, provision is made in i.f. amplifier 16 for varying the gain as a function of time during the interpulse reception period. Such a feature is commonly referred to as sensitivity time control (STC).

The signal output of i.f. amplifier 16 is detected at 17, then amplified in video amplifier 18. Video amplifier 18 is preferably of a known type having a logarithmic gain characteristic. The video signal output of amplifier 18 is filtered in a conventional R-C low-pass filter 36 having a high frequency roll-off characteristic with the corner frequency thereof, as it is conventionally defined, selectable at frequencies ranging between 68 KHz and 1.6 MHz, according to the range setting of the radar.

After filtering the video signal is converted from analog to digital form in a A/D converter 37 which is preferably of a known four level sample and hold type. The digitized output of converter 37 is a 3-bit binary number having a maximum value of decimal four corresponding to a received video signal of maximum amplitude. The digital output of converter 37 is supplied to the input data port of a microprocessor unit MPU 40 and to the input port of the memory system incorporated in display 19. Display 19 is preferably of the recirculating memory type as described, for example, in U.S. Pat. No. 3,964,064 to R. L. Brandao et al. MPU 40, represented by the dashed-line enclosure, is programmed to perform the functions shown by the boxes enclosed therein, as will be understood by those skilled in the art.

The automatic frequency control program is initiated by a control input signal on line 42 from transmitter control 29 to the sample cycle control function 43 of MPU 40. Sample cycle control 43 enables most significant byte (MSB) control 44 to output an eight bit binary number on line 45 to MSB D/A converter 46. The analog voltage output of converter 46 provides one input through resistor 47 to a summing network 50, which also includes resistors 48 and 49. The frequency control voltage for local oscillator 15 appears on line 51 from summing network 50. In a preferred embodiment of the invention local oscillator 15 is comprised by a Gunn diode type oscillator which typically produces an output frequency of 9375 MHz for a control voltage input on line 51 of approximately +6 v.

Initially, MSB control 44 furnishes an eight digit binary number on line 45 of sufficient value to provide a control voltage amplitude of approximately 15 v on line 51. The actual value of such number is dependent upon the conversion scale factor of D/A converter 46 and the attenuation of the output thereof by the summing junction of resistors 47 and 49.

Blanking switch 28 is operative approximately for the duration of the transmitter pulse. During this time, MPU 40 is responsive to the output of A/D converter 37. Threshold logic 52 determines whether the amplitude of the video signal equals or exceeds level three (binary 11). If the video signal is less than that level, sweep control 53 causes MSB control 44 to decrement the binary number being furnished to D/A converter 46, thereby reducing the local oscillator control voltage on line 51 to reduce the local oscillator frequency. For the higher selected radar ranges, where longer transmitter pulses are employed, two samplings of the video output level are taken from converter 37 during each transmitter pulse and two adjustments are made in the local oscillator frequency. When, by this process, the local oscillator frequency is reduced sufficiently close to the transmitter frequency to provide a difference frequency output from mixer 14 near the center of the passband of i.f. amplifier 16 the output of converter 37 will equal or exceed level three. Sweep control 53 then discontinues decrementing MSB control 44 and switches the output of threshold logic 52 to data register 54. Sweep control 53 also signals sample cycle control 43 to commence the local oscillator frequency side step routine, as discussed broadly with reference to FIG. 2.

At the beginning of the sidestep routine, control 43 receives the output number from MSB control 44 for access to a look-up table containing stored values of eight digit binary numbers ΔP and smaller valued incremental numbers ΔS. Because of the non-linearity of the frequency vs. control voltage characteristic of local oscillator 15, as shown typically in FIG. 5, it is necessary to correlate, by means of the look-up table, the values of ΔP and ΔS with the control voltage then present on line 51 in order to obtain equal side step frequency displacements throughout the tuning range of local oscillator 15. The number ΔP obtained from the look-up table of control 43 appears on line 55 as one input to adder 56. A second input to adder 56 appears on line 57 from an offset A/D converter 58 which prodces an eight digit binary number having a value dependent upon the voltage input thereto from a manually adjustable potentiometer 59. The purpose of offset converter 58 is to provide means for compensating for differences in the frequency response characteristics of mixer 14, waveguide components and the like resulting from manufacturing tolerances.

The output of adder 56 is converted from an eight digit binary number to an analog voltage in least significant byte (LSB) D/A converter 61. The voltage output of converter 61 is added to the output of converter 46 through resistor 48. The value of resistor 48 is suitably about sixteen times the value of resistor 47 so that the contribution of the output voltage of converter 46 to the control voltage on line 51 is of the order of sixteen times as great as the contribution of converter 61 thereto. In practice, the ratio of the values of resistor 48 to resistor 47 is selected in accordance with the desired resolution of fine tuning adjustments.

The first step of the local oscillator frequency side step routine adds the number ΔP to the contents of converter 61 which is initially centered at the binary equivalent of decimal 128. The local oscillator frequency is thereby displaced to a value corresponding to line 23, FIG. 2. The second step of the side step routine adds −ΔP to the contents of converter 61, thereby displacing the local oscillator frequency to a value corresponding to line 25, FIG. 2. Succeeding steps of the side step routine alternately add and subtract the number ΔP+n(ΔS), where n is related to the step number, to the contents of converter 61, thereby side stepping the local oscillator frequency through the values bounded by the lines 23–24 and 25–26 of FIG. 2. For each such side step producing an increase in local oscillator frequency, sweep control 53 applies the output of threshold logic 52 to a ΣH accumulator of data register 54 and for each such side step producing a decrease in local oscillator frequency sweep control 53 applies the output of threshold logic 52 to a ΣL accumulator of data register 54. After the side step routine is completed, i.e. after thirty-two sidesteps, control 43 causes the contents of the ΣH and ΣL to be compared in a subtractor 62, the output of which constitutes an error signal indicative of the tuning error of local oscillator 15. The error signal output of subtractor 62 is supplied as the integrand to an integrator 63, the output of which is added to the converter output on line 57 in adder 56 and the sum is applied to converter 61 for fine adjustment of the local oscillator frequency. If during the sidestep routine the contents of converter 61 are caused to overflow or underflow by the number furnished thereto by adder 56, the carry or borrow bit appearing from converter 61 is applied through overflow/underflow corrector 60 to increment or decrement converter 46, as may be appropriate. Converter 61 is then recentered at approximately the decimal value 128, and operation continues.

At the end of each sample cycle, i.e. at the end of each transmitted pulse, the number on line 55 is removed but the number on line 57 is retained at all times and the output of integrator 63 is retained, so long as control 43 does not cause reset of sweep control 53, to maintain the frequency adjustment of the local oscillator near the i.f. amplifier center frequency during the following interpulse period.

The data input to register 54 are binary level three (11) signals. For simplicity of computation, only the most significant bit (10) of the data input is recognized in register 54. Since the ΣH and ΣL outputs are summations of binary two's data the difference output of subtractor 62 is divided by two prior to integration to provide improved resolution in the local oscillator fine tuning adjustment.

The ΣH and ΣL from register 54 are added in adder 65 and the sum output thereof is furnished to sample cycle control 43 and AFC amplitude control 66. If the value of such sum is below a predetermined threshold, control 43 causes reset of sweep control 53. When reset, sweep control 53 clears the output number of MSB control 44 and clears integrator 63. The control signal on line 42 appearing with the next following transmitter pulse causes sample cycle control 43 to re-initialize MSB control 44 and the frequency sweep of the local oscillator is repeated during following transmitter pulses.

The automatic gain control (AGC) voltage for i.f. amplifier 16 is established during the interpulse receive period by applying the lowest level digitized output of converter 37 to an integrator which is gated active only during the final portion of the interpulse period. The output of integrator 67 is applied through threshold comparator means included therein to AGC control 68 which outputs a ten digit binary number in response thereto. The output of control 68, after passing through adder 69 is converted to AGC voltage by D/A converter 71. AGC control 68 responds to the output of the comparator means 67 to produce a number of such value that the voltage output of converter 71 on line 72 will set the gain of i.f. amplifier 16 at the proper value to maintain a constant false alarm rate (FAR) at the output of converter 37, as will be understood by those skilled in the art. The AGC voltage established by the means just described, which are analogous to means operating wholly with analog voltages as heretofore known, may be further refined by employing the sum output of adder 65 for fine adjustment. When the local oscillator frequency is adjusted to coincide with the center frequency of i.f. amplifier 16, as is indicated by zero output from subtractor 62 and an output from adder 65 exceeding the reset threshold level, control 43 enables AFC amplitude control 66. Control 66 compares the numerical output of adder 65 with a predetermined threshold to provide a numerical adjustment which is added to the numerical output of AGC control in adder 69, thereby effecting the fine adjustment of the AGC voltage on line 62.

Table I, below, contains a listing of the transmitter pulsewidths, pulse repetition frequencies, AFC sample cycle periods and video filter rolloff frequencies for various full scale range settings of one specific radar system embodying the invention.

TABLE 1

| Range | Pulse Width | Pulse Rep. Frequency | Sample Cycle Period | Video Filter Rolloff |
|---|---|---|---|---|
| 240 N.M. | 11.5 us. | 128 Hz | 11.7 us. | 68 KHz |
| 160 N.M. | 7.6 us. | 192 Hz | 7.8 us. | 145 KHz |
| 80 N.M. | 4.7 us. | 256 Hz | 3.8 us. | 318 KHz |
| 40 N.M. | 2.7 us. | 512 Hz | 1.9 us. | 600 KHz |
| 20 N.M. | 1.4 us. | 769 Hz | 0.97 us. | 1.6 MHz |
| 10 N.M. | 0.6 us. | 1026 Hz | 0.48 us. | 1.6 MHz |

The invention claimed is:

1. In a pulse-type radar system having a transmitter, an antenna, a superheterodyne receiver and a duplexer for coupling said transmitter and said receiver to said antenna, said receiver including
    a voltage controlled local oscillator,
    a mixer for combining the output of said local oscillator with signals applied to the input of said receiver to produce intermediate frequency signals, an intermediate frequency amplifier having automatic gain control means for amplifying said intermediate frequency signals and a video detector for detecting the output of said intermediate frequency amplifier;
    the method of automatically controlling the frequency of said local oscillator, comprising,
    generating a first digital number;
    converting said first digital number to a first analog voltage;
    applying said first analog voltage as the control voltage for said local oscillator to control the frequency thereof;
    varying the value of said first digital number during the time output from said transmitter is present at said duplexer;
    sampling the output of said video detector to determine the amplitude thereof during the time output from said transmitter is present at said duplexer and leakage signals from said transmitter pass through said duplexer to said receiver input;
    comparing said sampled video detector output with a predetermined threshold;
    discontinuing variation of the value of said first digital number when said sampled video output exceeds said predetermined threshold; and
    maintaining said first digital number at the value existing at the time variation thereof is discontinued to control the frequency of said local oscillator during the time signals from said antenna are applied through said duplexer to said receiver.

2. The method of claim 1 including the additional steps comprising,
    generating a second digital number;
    converting said second digital number to a second analog voltage;
    combining said second analog voltage with said first analog voltage for application as the control voltage for said local oscillator during the time leakage signals from said transmitter pass through said duplexer to said receiver input;
    varying said second digital number to cause variation of said local oscillator control voltage and attendant variation of said local oscillator frequency above and below the frequency thereof established by said first analog voltage alone;
    accumulating said sampled detector outputs when said local oscillator frequency is caused by said second digital number to vary above the frequency thereof established by said first analog voltage alone to provide a first sample sum;

accumulating said sampled detector outputs when said local oscillator frequency is caused by said second digital number to vary below the frequency thereof established by said first analog voltage alone to provide a second sample sum;

obtaining the difference between said first and said second sample sums;

integrating said difference to generate a third digtal number;

converting said third digital number to a third analog voltage;

after generation of said third analog voltage combining said first, said second and said third analog voltages for application as the control voltage for said local oscillator during the time leakage signals from said transmitter pass through said duplexer to said receiver input; and combining said third analog voltage with said first analog voltage for application as the control voltage for said local oscillator during the time signals from said antenna pass through said duplexer to said receiver input.

3. The method of claim 2 including the additional steps comprising, obtaining the sum of said first and said second sample sums;

comparing said sum of said first and said second sample sums with a predetermined threshold;

generating a fourth digital number proportional to said sum of said first and said second sample sums whenever said sum of said first and second sample sums exceed said predetermined threshold;

converting said fourth digital number to a fourth analog voltage; and applying said fourth analog voltage to said intermediate frequency amplifier to control the gain thereof whenever the difference between said first and said second sample sums is substantially zero.

4. In a pulse-type radar having a transmitter, a receiver, an antenna and a duplexer for coupling signals from said transmitter to said antenna for radiation and signals received by said antenna to said receiver for detection and display, said receiver including a voltage controlled local oscillator, a mixer, an intermediate frequency amplifier for amplifying the output of said mixer, a video detector for detecting the output of said intermediate frequency amplifier, and an analog to digital converter for the video output of said detector, an automatic frequency control for said receiver local oscillator, comprising, means for generating a first digital number;

a digital to analog converter for converting said first digital number to a first analog voltage; said first analog voltage being applied to said receiver local oscillator to control the frequency thereof;

sample cycle control means for establishing: a first period during which output from said transmitter is present at said duplexer and leakage signals from said transmitter pass through said duplexer to said mixer; and a second period during which signals received by said antenna pass through said duplexer to said mixer;

means for sampling the output of said receiver analog to digital converter during said sample cycle first period;

sweep means for varying the value of said first digital number during said sample cycle first period;

logic means receiving the output of said sampling means and producing an output whenever said sampling means output exceeds a predetermined value; and control means responsive to the output of said logic means for causing said sweep means to haul variation of said first digital number and to hold the value thereof producing output from said logic means.

5. An automatic frequency control as claimed in claim 4, with additionally, means for generating a second digital number during said sample cycle first period;

means for converting said second digital number to a second analog voltage;

means for accumlating successive outputs from said sampling means for successive ones of said sample cycle first periods;

means controlled by said accumulating means for generating a third digital number;

means for converting said third digital number to a third analog voltage; and means for combining said first, said second and said third analog voltages for application to said local oscillator to control the frequency thereof during said sample cycle first period and for combining said first and said third analog voltages for application to said local oscillator to control the frequency thereof during said sample cycle second period.

6. An automatic frequency control as claimed in claim 5 wherein said means for generating a second digital number includes;

means for generating a second digital number during a first sample cycle first period;

means for generating the complement of said second digital number during said first period of a second sample cycle immediately following said first sample cycle;

and wherein said means for converting said second digital number to a second analog voltage is responsive to said second digital number to produce a second analog voltage of positive sense and is responsive to the complement of said second digital number to produce a second analog voltage of negative sense.

7. An automatic frequency control as claimed in claim 6 wherein said means for accumulating successive outputs from said sampling means includes;

first accumulating means for accumulating outputs from said sampling means when said second analog voltage is of positive sense; and second accumulating means for accumulating outputs from said sampling means when said second analog voltage is of negative sense.

8. An automatic frequency control as claimed in claim 7 wherein said means controlled by said accumulating means for generating a third digital number is responsive to the difference between the outputs of said first and said second accumulating means.

9. An automatic frequency control as claimed in claim 7, with additionally;

means providing the sum of the outputs of said first and second accumulating means;

means responsive to said sum of outputs for generating a fourth digital number; means for converting said fourth digital number to a fourth analog voltage; and means responsive to said fourth analog voltage for adjusting the gain of said receiver intermediate frequency amplifier.

10. An automatic frequency control as claimed in claim 7, with additionally;

means providing an adjustable fifth analog voltage;

means for converting said fifth analog voltage to a fifth digital number; and means for adding said fifth digital number to said third digital number.

* * * * *